(12) United States Patent
Zhang

(10) Patent No.: US 9,281,353 B2
(45) Date of Patent: Mar. 8, 2016

(54) ORGANIC THIN FILM TRANSISTOR ARRAY SUBSTRATE, METHOD FOR MANUFACTURING THE SAME AND DISPLAY DEVICE

(71) Applicant: BOE TECHNOLOGY GROUP CO., LTD., Beijing (CN)

(72) Inventor: Xuehui Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 86 days.

(21) Appl. No.: 13/824,540

(22) PCT Filed: Dec. 7, 2012

(86) PCT No.: PCT/CN2012/086222
§ 371 (c)(1),
(2) Date: Mar. 18, 2013

(87) PCT Pub. No.: WO2013/159538
PCT Pub. Date: Oct. 31, 2013

(65) Prior Publication Data
US 2014/0110677 A1    Apr. 24, 2014

(30) Foreign Application Priority Data

Apr. 24, 2012 (CN) .......................... 2012 1 0123042
Jul. 30, 2012 (CN) .......................... 2012 1 0269320

(51) Int. Cl.
*H01L 27/32* (2006.01)
*H01L 51/56* (2006.01)
(Continued)

(52) U.S. Cl.
CPC ...... *H01L 27/3274* (2013.01); *G02F 1/136227* (2013.01); *G02F 1/136286* (2013.01);
(Continued)

(58) Field of Classification Search
CPC ............ H01L 51/0022; H01L 51/0541; H01L 27/3274; H01L 51/56; H01L 51/0003; H01L 27/283; H01L 27/3244; G02F 1/136227; G02F 1/136286; G02F 1/136295
USPC .................... 257/40, 59, 79, 72, 66, E51.001, 257/E51.006; 438/82, 99, 34
See application file for complete search history.

(56) References Cited

U.S. PATENT DOCUMENTS

2006/0065914 A1    3/2006  Chen et al.
2007/0152558 A1*   7/2007  Song et al. .................... 313/309
(Continued)

FOREIGN PATENT DOCUMENTS

| CN | 1983620 A | 6/2007 |
|----|-----------|--------|
| CN | 1991480 A | 7/2007 |

(Continued)

OTHER PUBLICATIONS

International Preliminary Report on Patentability Appln. No. PCT/CN2012/086222; Dated Oct. 28, 2014.
(Continued)

*Primary Examiner* — Thinh T Nguyen
(74) *Attorney, Agent, or Firm* — Ladas & Parry LLP

(57) ABSTRACT

According to embodiments of the present invention, there are provided an organic semiconductor array substrate, a method for manufacturing the same and a display device. The organic thin film transistor array substrate comprises a pixel structure formed on a transparent substrate; the pixel structure includes: a gate line, a data line, an organic thin film transistor, a pixel electrode, a common electrode line and a common electrode; the organic thin film transistor includes a gate electrode, a gate insulating layer, an organic semiconductor layer, a source electrode and a drain electrode; above the data line, the source electrode, the drain electrode and the pixel electrode, there are disposed in order a first bank insulating layer and a second bank insulating layer from bottom to top; and at openings and through holes of the first bank insulating layer and the second bank insulating layer, the pixel structure is formed by printing.

17 Claims, 5 Drawing Sheets

(51) Int. Cl.
 *G02F 1/1362* (2006.01)
 *H01L 51/00* (2006.01)
 *H01L 51/05* (2006.01)
(52) U.S. Cl.
 CPC ........ *H01L51/0022* (2013.01); *H01L 51/0541* (2013.01); *H01L 51/56* (2013.01); *G02F 2001/136295* (2013.01); *H01L 27/3276* (2013.01); *H01L 51/0005* (2013.01)

(56) References Cited

U.S. PATENT DOCUMENTS

| | | | |
|---|---|---|---|
| 2007/0153180 A1* | 7/2007 | Lim et al. | 349/122 |
| 2008/0258138 A1 | 10/2008 | Song et al. | |
| 2009/0026445 A1 | 1/2009 | Noh et al. | |
| 2009/0081820 A1 | 3/2009 | Park et al. | |
| 2012/0032207 A1 | 2/2012 | Nishiyama et al. | |

FOREIGN PATENT DOCUMENTS

| | | |
|---|---|---|
| CN | 101393897 A | 3/2009 |
| CN | 101556417 A | 10/2009 |
| CN | 107289106 A | 11/2012 |
| EP | 2196980 A1 | 6/2010 |
| KR | 20070053300 A | 5/2007 |
| KR | 20070071163 A | 7/2007 |
| KR | 20090010698 A | 1/2009 |
| KR | 20090124546 A | 12/2009 |

OTHER PUBLICATIONS

Korean Notice of Allowance Appln. No. 10-2013-7009807; Dated Nov. 28, 2014.
International Search Report Issued Jun. 5, 2013; Appln. No. PCT/CN2012/086222.
First Chinese Office Action Issued Jun. 3, 2014; Appln. No. 201210269320.8
First Korean Office Action Issued May 20, 2014; Appln. No. KR 10-2009-0010698.
Extended European Search Report dated Aug. 18, 2015; Appln. No. 12830908.5—1552 / 2672316 PCT/CN2012086222.

* cited by examiner

ORGANIC THIN FILM TRANSISTOR ARRAY SUBSTRATE, METHOD FOR MANUFACTURING THE SAME AND DISPLAY DEVICE

TECHNICAL FIELD

Embodiments of the present invention relate to an organic thin film transistor array substrate, a method for manufacturing the same and a display device.

BACKGROUND

Organic thin film transistor (OTFT) array substrates are adaptable for large-area processing, can make use of flexible substrates, and have advantages such as lower costs of process and so on, and therefore they possess good growth prospective in the field of flat panel displays. Generally, a plurality of patterning processes are required to form a patterned layered structure during fabrication of an OTFT array substrate. In this course, a large amount of raw materials for a gate electrode, a gate insulating layer and an organic semiconductor are consumed, and fabricating efficiency is relatively low.

A liquid crystal display using an advanced super dimension switch (ADS) technology is a wide-viewing-angle display, in which a multi-dimensional electric field is formed by an electric field produced at edges of slit electrodes on the same plane and an electric field produced between a layer of the slit electrodes and a layer of a plate-like electrode, so as to allow liquid crystal molecules of all alignment within a liquid crystal cell, which are located directly above the electrode and between the slit electrodes, to be rotated, thereby enhancing the work efficiency of liquid crystals and increasing the transmissive efficiency. The advanced super dimension switch technology can improve the picture quality of TFT-LCD products, and has advantages such as high resolution, high transmittance, low power consumption, wide viewing angle, high aperture ratio, low chromatic aberration, push Mura-free, etc.

For an ADS mode liquid crystal display panel, during fabrication of an organic thin film transistor array substrate, the formation of a gate electrode, a gate insulation, an organic semiconductor layer, source and drain electrodes, a signal line and a pixel electrode is usually formed through a plurality of patterning processes, including deposition, exposure and etching are performed for several times. This leads to a cumbersome process, a lower efficiency and serious waste of materials for fabrication of the organic thin film transistor.

SUMMARY

In an aspect of the present invention, there is provided an OTFT array substrate comprising a pixel structure formed on a transparent substrate. The pixel structure includes: a gate line, a data line, an OTFT, a pixel electrode, a common electrode line and a common electrode; and the OTFT includes a gate electrode, a gate insulating layer, an organic semiconductor layer, a source electrode and a drain electrode. Above the data line, the source electrode, the drain electrode and the pixel electrode, there are disposed in order a first bank insulating layer and a second bank insulating layer from bottom to top; in the first bank insulating layer, there are provided a first through hole, a first opening and a second opening; in the first opening, there is formed the gate line by printing, and in the second opening, there is formed the common electrode line by printing; in the first through hole, there are formed in order the organic semiconductor layer, the gate insulating layer and the gate electrode by printing from bottom to top, the gate electrode is connected with the gate line, and the organic semiconductor layer is connected with the source electrode and the drain electrode.

In another aspect of the present invention, there is provided a method for manufacturing an OTFT array substrate, comprising:

depositing a transparent conductive thin film on a transparent substrate, and forming a data line, a source electrode, a drain electrode and a pixel electrode through a patterning process;

coating and solidifying a photosensitive resin to form a first bank insulating layer, performing exposure and development in the first bank insulating layer so as to form a first through hole, a first opening and a second opening, forming an organic semiconductor layer in the first through hole by printing, printing the gate insulating layer on the organic semiconductor layer, and forming the gate electrode, the gate line and the common electrode line on the gate insulating layer and in the first opening and the second opening by printing, wherein the organic semiconductor layer is connected with the source electrode and the drain electrode; and coating and solidifying a photosensitive resin again to form a second bank insulating layer, forming a third opening and a second through hole intercommunicated with each other in the second bank insulating layer by exposure and development, and forming a common electrode in the second through hole and the third opening by printing, wherein the third opening covers the pixel electrode and is arranged in a comb shape.

In still another aspect of the present invention, there is further provided a display device comprising the above organic thin film transistor array substrate.

In the OTFT array substrate and the method for manufacturing the same and the display device provided by the embodiments of the invention, structures of the organic semiconductor layer, the gate insulating layer, the gate electrode, the gate line, the common electrode, the common electrode line and so on in the OTFT array substrate are formed in a quick and high-effective way by means of forming the first bank insulating layer and the second bank insulating layer with the photosensitive resin, respectively, and forming the organic semiconductor layer, the gate insulating layer, the gate electrode, the gate line, the common electrode and the common electrode line by printing in the through holes and the openings of the first bank insulating layer and the second bank insulating layer. By this means, materials for forming structures of the organic semiconductor layer, the gate insulating layer, the gate electrode, the gate line, the common electrode, the common electrode line and so on are saved, and moreover accuracy of structures of the organic semiconductor layer, the gate insulating layer, the gate electrode, the gate line, the common electrode, the common electrode line and so on can be controlled better.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DESCRIPTION OF REFERENCE NUMERALS

Figure 1:
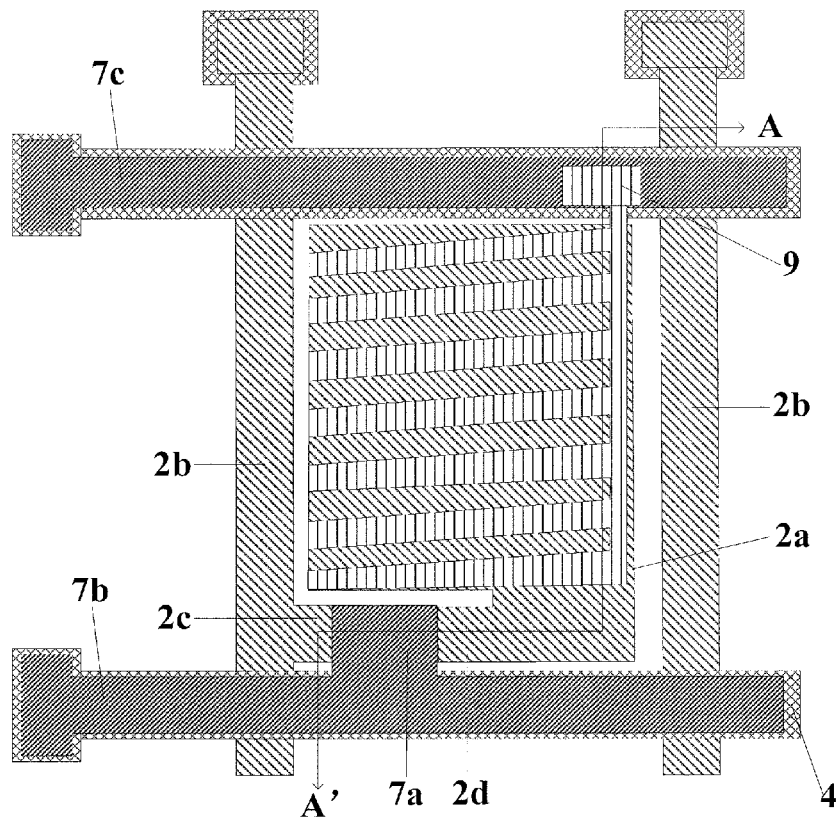
FIG. 1 is a top view showing an OTFT array structure according to an embodiment of the invention.

1—transparent substrate; 2—transparent conductive thin film; 2a—pixel electrode; 2b—data line; 2c—source electrode; 2d—drain electrode; 3—metal thin film; 4—first bank insulating layer; 4a—first through hole; 4b—first opening; 4c—second opening; 5—organic semiconductor layer; 6—gate insulating layer; 7a—gate electrode; 7b—gate line; 7c—common electrode line; 8—second bank insulating layer; 8a—third opening; 8b—second through hole; 9—common electrode; 10—photoresist; 10a—fully-retained region; 10b—partially-retained region; 10c—fully-removed region.

DETAILED DESCRIPTION

In order to make objects, technical details and advantages of the embodiments of the invention apparent, hereinafter the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

Unless otherwise defined, the technical terminology or scientific terminology used herein should have the same meaning as those commonly understood by one of ordinary skill in the art to which this invention belongs. Terms such as "first", "second" and the like used in specification and claims of the patent application of the invention do not show any order, number or importance, but are only used to distinguish different constituent parts. Likewise, the term such as "a," "an," "the" or the like does not indicate limitation in number, but specifies the presence of at least one. A term "comprises," "comprising," "includes," "including", "contains" or the like means that an element or article ahead of this term encompasses element(s) or article(s) listed behind this term and its (their) equivalents, but does not preclude the presence of other elements or articles. A term such as "connection," or the like is not limited to physical or mechanical connection, but can include electrical connection, whether directly or indirectly. "Upper," "lower," "left," "right" or the like are only used to describe a relative positional relationship, and when an absolute position of the described object is changed, the relative positional relationship might also be changed accordingly.

An array substrate according to an embodiment of the invention comprises a plurality of gate lines and a plurality of data lines, and these gate lines and data lines intersect each other to thereby define pixel units arranged in a matrix, each of which includes a thin film transistor functioning as a switch element and a pixel electrode and a common electrode that are adapted to control alignment of liquid crystals. For example, as for the thin film transistor of each pixel, its gate electrode is electrically connected with or integrally formed with a corresponding gate line, its source electrode is electrically connected with or integrally formed with a corresponding data line, and its drain electrode is electrically connected with or integrally formed with a corresponding pixel electrode. The following descriptions are made mainly on a single pixel unit or a plurality of pixel units, but other pixel unit(s) can be formed in the same way.

Figure 2:
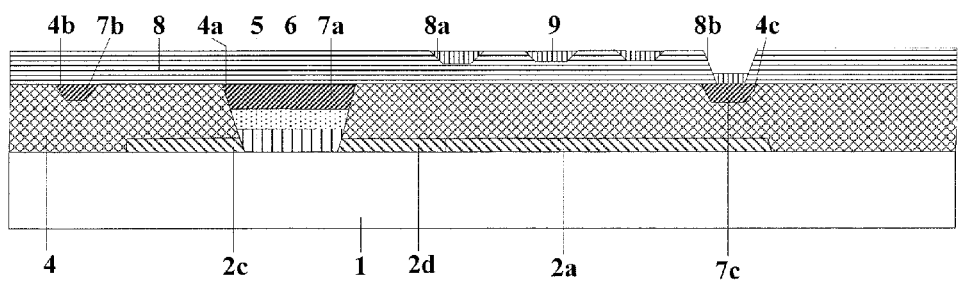
FIG. 2 is a diagram showing a cross-sectional view of the OTFT array structure taken along line A-A' according to the embodiment of the invention.

An organic thin film transistor (OTFT) array substrate according to an embodiment of the invention, as shown in FIG. 1 and FIG. 2 (which is a cross sectional view taken along line A-A' in FIG. 1), comprises a pixel structure (of a pixel unit) formed on a transparent substrate 1.

The pixel structure includes a gate line 7b, a data line 2b, an OTFT, a pixel electrode 2a, a common electrode 9 and a common electrode line 7c.

The OTFT includes a gate electrode 7a, a gate insulating layer 6, an organic semiconductor layer 5, a source electrode 2c and a drain electrode 2d.

Above the data line 2b, the source electrode 2c, the drain electrode 2d and the pixel electrode 2a, there are disposed in order a first bank insulating layer 4 and a second bank insulating layer 8 from bottom to top.

In the first bank insulating layer 4, there are provided a first through hole 4a, a first opening 4b and a second opening 4c. Here, when a through hole and an opening formed in a bank insulating layer is mentioned, the through hole passes through the whole bank insulating layer, and the opening is a groove formed in the bank insulating layer with a part of the bank insulating layer left at its bottom.

In the first opening 4b, there is formed the gate line 7b by printing, and in the second opening 4c, there is formed the common electrode line 7c by printing.

In the first through hole 4a, there are formed in order the organic semiconductor layer 5, the gate insulating layer 6 and the gate electrode 7a by printing from bottom to top, the gate electrode 7a is connected with the gate line 7b, and the organic semiconductor layer 5 is connected with (contacts) the source electrode 2c and the drain electrode 2d.

In the second bank insulating layer 8, there are provided a third opening 8a and a second through hole 8b intercommunicated with each other, and the pixel electrode 2a can be covered by the third opening 8a in a comb shape from the above.

The second through hole 8b is communicated with the second opening 4c.

In the third opening 8a and the second through hole 8b, there is formed the common electrode 9 by printing. The common electrode 9 and the common electrode line 7c contact with each other by the connection in the second through hole 8b.

For example, the source electrode 2c, the drain electrode 2d, the pixel electrode 2a and the data line 2b are formed by etching upon the same transparent conductive thin film 2, respectively. The gate electrode 7a, the gate line 7b and the common electrode line 7c are formed by printing, respectively. The transparent substrate 1 may be a plastic substrate, a glass substrate, or the like.

Optionally, on surfaces of the source electrode 2c, the drain electrode 2d and the data line 2b, there are further disposed a metal thin film 3.

Optionally, the source electrode 2c and the drain electrode 2d extend into the first through hole 4a, the source electrode 2c and the drain electrode 2d are not connected with but opposed to each other, and distance between the source electrode 2c and the drain electrode 2d is smaller than distance between the metal thin films 3 on two sides of the first through hole 4a.

Optionally, the thickness of the organic semiconductor layer 5 is larger than the thickness of each of the source electrode 2c and the drain electrode 2d.

Optionally, the organic semiconductor layer 5 is connected with the sidewalls of the source electrode 2c and the drain electrode 2d on two sides of the first through hole 4a.

Optionally, the first bank insulating layer 4 and the second bank insulating layer 8 are of a photosensitive resin material.

Optionally, the materials of the data line 2b, the source electrode 2c, the drain electrode 2d, the pixel electrode 2a and the common electrode 9 are indium tin oxide, indium zinc oxide and other conductive materials.

Optionally, the material for the organic semiconductor layer 5 may be a thiophene compound, a phthalocyanine compound, or the like.

Optionally, the material of the gate insulating layer 6 may be polyvinyl alcohol.

Optionally, the gate electrode 7a may be of one of a conductive polythiophene compound, copper or silver.

Optionally, the top surfaces of the gate line 7b disposed in the first opening 4b, the common electrode line 7b disposed in the second opening 4c and the gate electrode 7a disposed in the first through hole 4a are flush with the top surface of the first bank insulating layer 4.

Figure 3:
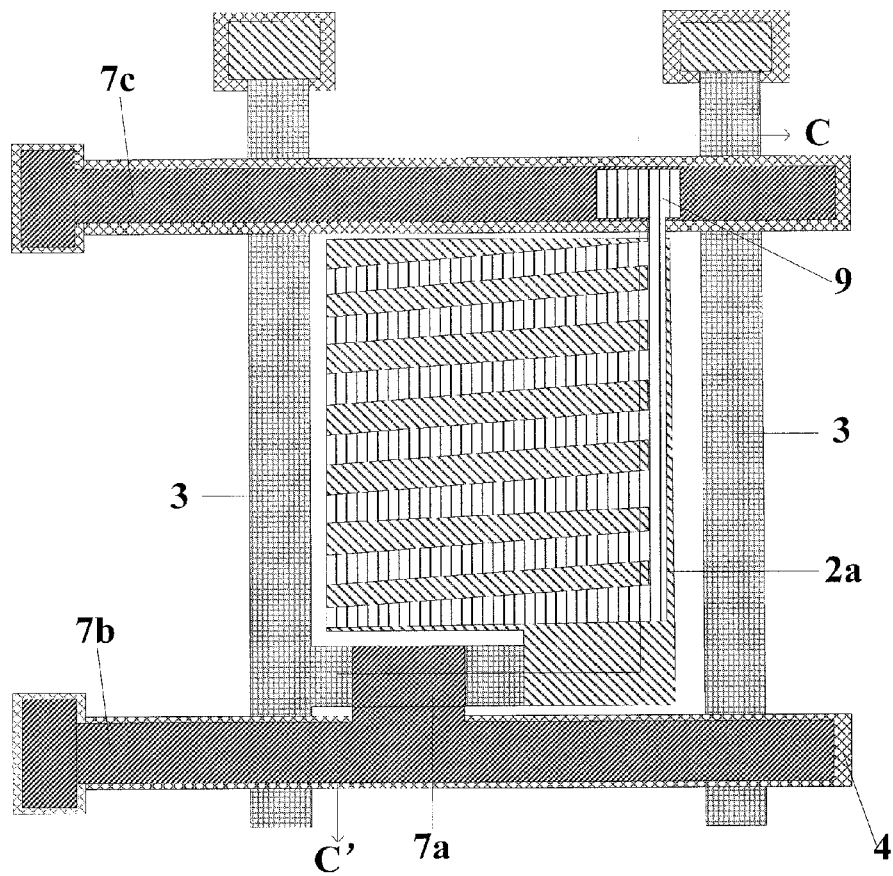
FIG. 3 is a top view showing another OTFT array structure according to an embodiment of the invention.
Figure 4:
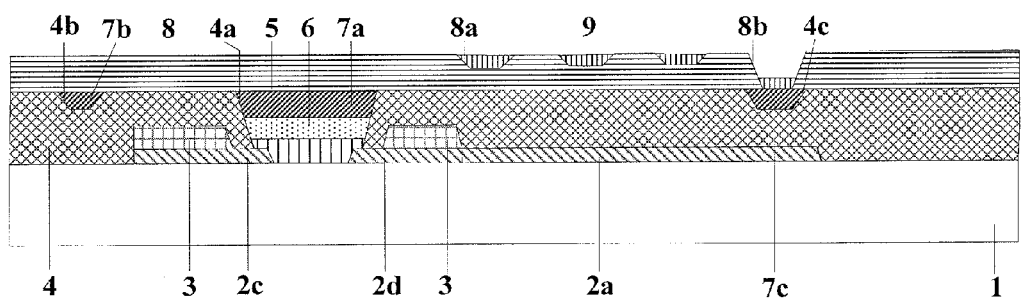
FIG. 4 is a diagram showing a cross-sectional view of the another OTFT array structure taken along line C-C' according to the embodiment of the invention.

In order to improve the conductivity of the data line 2b, the source electrode 2c and the drain electrode 2d of the above OTFT array substrate and enhance the charging speed of the pixel electrode 2a, optionally, as shown in FIG. 3 and FIG. 4 (where FIG. 4 is a cross-sectional view taken along line C-C' in FIG. 3), on surfaces of the source electrode 2c, the drain electrode 2d and the data line 2b there are disposed a metal thin film 3. The material for the metal thin films 3 may be any one of aluminum, tungsten, chromium, tantalum, molybdenum or copper.

Because the organic semiconductor layer 5 is only connected with the sidewalls of the source electrode 2c and the drain electrode 2d when connected with the source electrode 2c and the drain electrode 2d, the case of false connection tends to occur. Thus, for the purpose of enlarging connection areas between the organic semiconductor layer 5 and the source drain 2c and the drain electrode 2d to avoid the case of false connection, optionally, the source electrode 2c and the drain electrode 2d may extend into the first through hole 4a, the source electrode 2c and the drain electrode 2d are not connected with each other, and the distance between the source electrode 2c and the drain electrode 2d is smaller than the distance between the metal thin film 3 on two sides of the first through hole 4a.

In correspondence with one of the above-mentioned OTFT array substrates, there is further provided a method for manufacturing an OTFT array substrate according to an embodiment of the invention, comprising the following steps.

Step 100: a transparent conductive thin film is deposited on a transparent substrate.

A transparent conductive thin film 2 is deposited on a transparent substrate 1. The transparent conductive thin film 2 may be of indium tin oxide, indium zinc oxide or the like conductive material, and the transparent substrate 1 may be a plastic substrate, a glass substrate, or the like.

Step 101: photoresist is coated, and by using a patterning process with the photoresist, a data line, a source electrode, a drain electrode and a pixel electrode are formed through etching, and the remaining photoresist is removed.

Here, the patterning process, for example, includes coating of photoresist, exposure and development, etching, removing of photoresist, etc., and the details of the processes will not be mentioned below.

Figure 5:
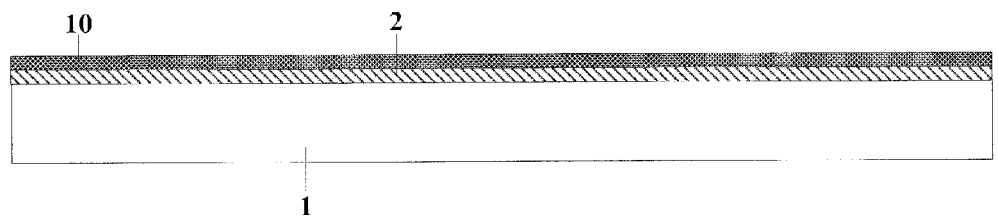
FIG. 5 is a structurally schematic view after a transparent conductive thin film and a photoresist are deposited in a manufacturing method according to an embodiment of the invention.
Figure 6:
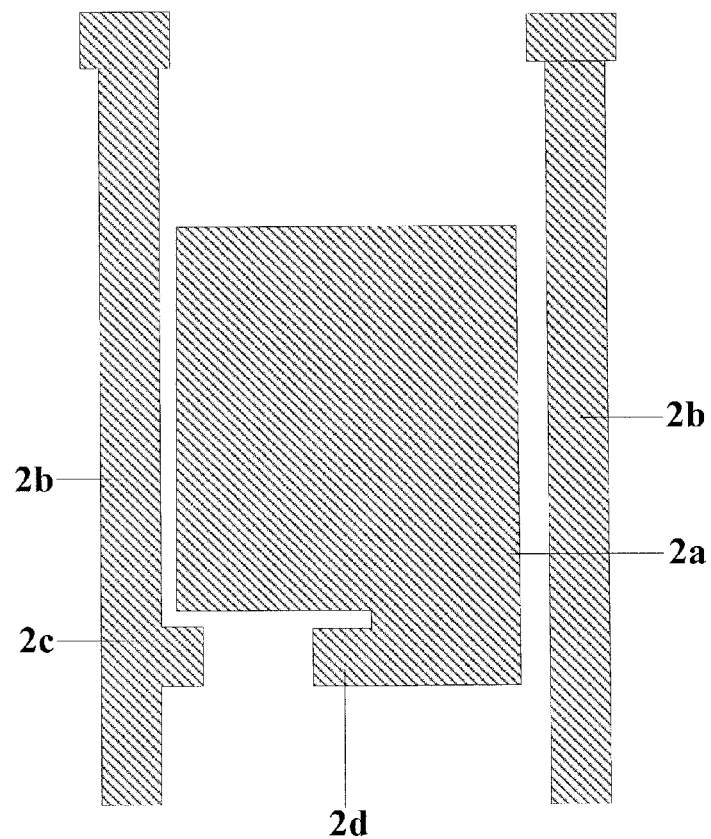
FIG. 6 is a top view after the transparent conductive thin film is etched in the manufacturing method according to the embodiment of the invention.

As shown in FIG. 5, photoresist 10 is spin-coated on the transparent conductive thin film 2; a first patterning process is performed to etch the transparent conductive thin film 2, as shown in FIG. 6, thereby forming a pixel electrode 2a, a data line 2b, a source electrode 2c and a drain electrode 2d; and after finishing of the etching, the remaining photoresist 10 is removed with a stripper agent.

Step 102: a photosensitive resin is coated and solidified to form a first bank insulating layer, exposure and development are performed on the first bank insulating layer through a double-tone mask (for example a half-tone mask or a grey-tone mask) so as to form a first through hole, a first opening and a second opening; an organic semiconductor layer is formed in the first through hole by printing, a gate insulating layer is printed on the organic semiconductor layer, and a gate electrode, a gate line and a common electrode line are formed on the gate insulating layer and in the first opening and the second opening by printing. The organic semiconductor layer is connected with the source electrode and the drain electrode.

Figure 7:
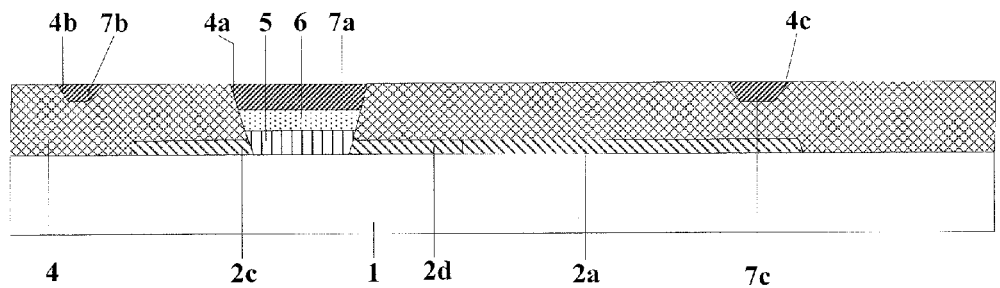
FIG. 7 is a cross-sectional view showing formation of a first bank insulating layer and structures encompassed by it in the manufacturing method according to the embodiment of the invention.

As shown in FIG. 7, a solution of a photosensitive resin, which may be a solution of polymethylmethacrylate, is coated on the transparent substrate 1. After the photosensitive resin covers the surface of the transparent substrate 1, for example, a pre-baking can be performed for 1 minute to 30 minutes in the condition of 110 Celsius degree or so, so as to make the solvent in the photosensitive resin solution volatilizing.

After exposure and development are performed with the double-tone mask, a first through hole 4a, a first opening 4b and a second opening 4c are formed. For example, the double-tone mask above is made to cover the photosensitive resin, wherein the mask is a half-tone mask or a grey-tone mask, of which the half-tone or grey-tone parts are partially transmissive regions of the mask and correspond to the portions of the surface of the photosensitive resin where the first opening 4b and the second opening 4c are to be formed; a fully lightproof region of the mask corresponds to a fully-retained region of the photosensitive resin; and a fully transmissive region of the mask corresponds to a fully-removed region of the photosensitive region and is adapted to form the first through hole 4a in which the sidewalls of the source electrode 2c and the drain electrode 2d are exposed. After completion of the exposure and development of the photosensitive resin, for example, in the condition of about 130 Celsius degree, a post-baking is performed for 1 minute to 30 minutes so that the photosensitive resin containing the first through hole 4a, the first opening 4b and the second opening 4c is solidified. Thereby, the first bank insulating layer 4 is formed.

After formation of the first bank insulating layer 4, printing is performed at the first through hole 4a, the first opening 4b and the second opening 4b by controlling a printing apparatus such as a printer. Firstly, an organic semiconductor solution for forming the organic semiconductor layer 5 is printed in the first through hole 4a. Next, the organic semiconductor solvent is evaporated so as to form the organic semiconductor layer 6, and during evaporation of the organic semiconductor solvent, an annealing process may further be carried out to make compositions in the organic semiconductor solution uniform. For example, the thickness of the organic semiconductor layer 5 is larger than that of each of the source electrode 2c and the drain electrode 2d, so that the organic semiconductor layer 5 fully contacts the sidewalls of the source electrode 2c and the drain electrode 2d on both sides of the organic semiconductor layer 5. Thereafter, a solution for forming an gate insulating layer 6, which may be of polyvinyl alcohol, is printed on a surface of the organic semiconductor layer, and after evaporation of the solution, the gate insulating layer 6 is formed. Then, after formation of the gate insulating layer 6, a gate-electrode material, a solution or liquid for which may be a conductive polythiophene solution, a copper paste or a silver paste, is printed on the surface of the gate insulating layer 6 and in the first opening 4b and the second opening 4c, respectively, and after the solvent is evaporated or the liquid is solidified, a gate electrode 7a, a gate line 7b and a common electrode line 7c are formed, respectively.

The first bank insulating layer 4 containing the first through hole 4a, the first opening 4b and the second opening 4c are formed on the photosensitive resin by exposure and development, and printing is performed at the first through hole 4a, the first opening 4b and the second opening 4c of the first bank insulating layer 4, so that the scope of the printed solution or liquid can be limited. The openings and the through hole are provided in the bank insulating layer, so that accuracy of ink printing can be ensured. Accordingly, accuracy of the formed organic semiconductor layer 5, the gate insulating layer 6, the gate electrode 7a, the signal line 7b and the common electrode 7c is guaranteed, and contact areas between the organic semiconductor layer 5 and the source electrode 2c and the drain electrode 2d are ensured. Thus, properties of the formed OTFT are guaranteed.

Step 103: a photosensitive resin is coated again, and solidified to form a second bank insulating layer, a third opening and a second through hole intercommunicated with each other are formed in the second bank insulating layer by exposure and development, and a common electrode is formed in the second through hole and the third opening by printing, the pixel electrode being covered by the third opening in a comb shape from above.

As shown in FIG. 2, a photosensitive resin is coated again on the first bank insulating layer 4, and after the photosensitive resin covers the first bank insulating layer 4, for example, a pre-baking is performed for 1 minute to 30 minutes in a condition of about 110 Celsius degree, so as to make the solvent of the photosensitive resin volatilizing. Exposure and development are performed on the photosensitive resin, thereby forming the third opening 8a and the second opening 8b intercommunicated with each other. The second opening 8b is communicated with the second opening 4c, and the pixel electrode 2a can be covered by the third opening 8a in a comb shape from above. Next, for example, a post-baking is performed for 1 minute to 30 minutes in a condition of about 110 Celsius degree so as to form a second bank insulating layer 8 through solidification; a solution for forming a common electrode 9 is printed in the second through hole 8b and the third opening 8a, and the solvent is evaporated, so as to form the common electrode 9.

Because the solution for forming the common electrode 9 is printed in the through hole 8b and the third opening 8a of the second bank insulating layer 8, diffusion of the solution for forming the common electrode is limited and accuracy of the pixel structure is ensured. Thus, the display properties of pixels are guaranteed.

An ink printing process can be such a process in which, ink (material for forming the gate electrode 7a, the gate insulating layer 6, the organic semiconductor layer 5, the gate line 7b, the common electrode line 7c and the common electrode 9) used for realizing a pattern is printed on a region, in which a pattern needs to be formed, so as to form the desired pattern. Because this process is a method of directly forming a patterned, layered structure, fabricating the organic thin film transistor array substrate by means of printing can simplify the manufacturing process, save the material, reduce costs and improve production efficiency, and the contact areas between the organic semiconductor layer 5 and the source electrode 2c and the drain electrode 2d can be ensured. High pattern accuracy of this process facilitates improvement of the properties of thin film transistors. Moreover, fabricating the common electrode line with an ink printing process can form a comb-shaped pattern of the common electrode precisely, to thereby ensure the display quality.

In the OTFT array substrate according to the embodiment, the charging speed of the pixel electrode may affect display effect of the liquid crystal display panel. In order to improve the charging speed of the common electrode 2a by the data line 2b, optionally, after the transparent conductive thin film is deposited on the transparent substrate, deposition of a metal thin film may be further performed.

Figure 8:
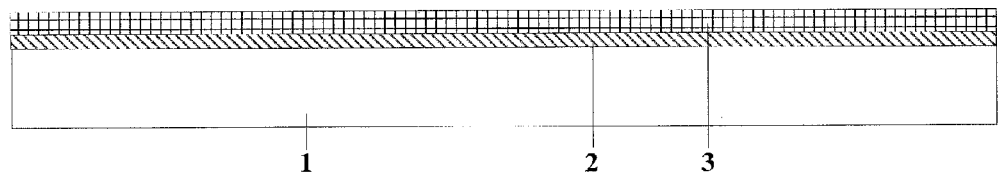
FIG. 8 is a cross-sectional view after a transparent conductive thin film and a metal thin film are deposited in another manufacturing method according to an embodiment of the invention.

After the transparent conductive thin film 2 is deposited on the transparent substrate 1, as shown in FIG. 8, a metal thin film 3 is deposited on a surface of the transparent conductive thin film 2. The deposition is carried out in a sputtering apparatus for example, in which the accelerated plasma of an inert gas strikes a target, and atoms of the target which are struck out are uniformly attached to the transparent conductive thin film 2 under the actions of an electric field and a magnetic field, so as to form the metal thin film 3. The material of the metal thin film 3 may be one of aluminum, tungsten, chromium, tantalum, molybdenum or copper.

Figure 9:
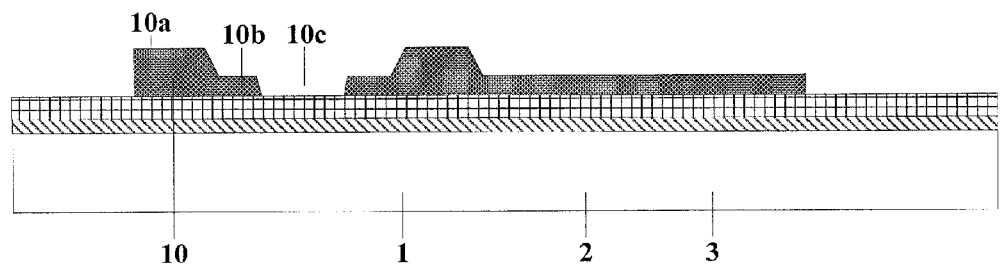
FIG. 9 is a cross-sectional view after a photoresist is patterned in another manufacturing method according to the embodiment of the invention.
Figure 10:
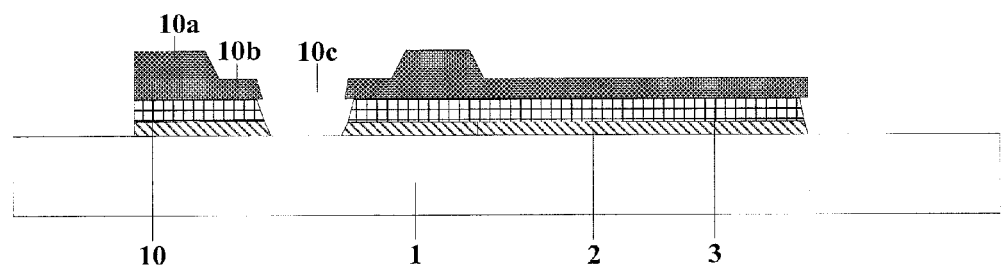
FIG. 10 is a cross-sectional view after a first etching in another manufacturing method according to the embodiment of the invention.
Figure 11:
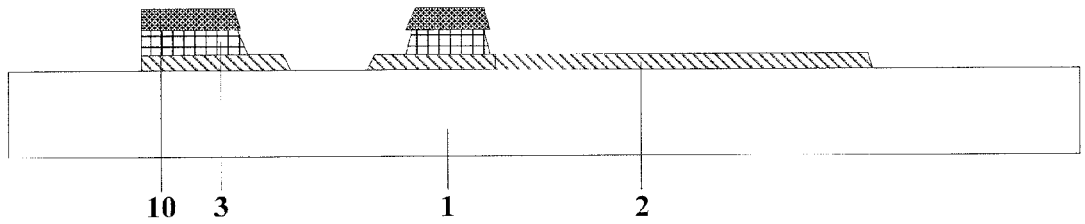
FIG. 11 is a cross-sectional view after a second etching in another manufacturing method according to the embodiment of the invention.

After formation of the above metal thin film 3, optionally, photoresist is coated, and by using a patterning process with the photoresist, a data line, a source electrode, a drain electrode and a pixel electrode are formed through etching, and the remaining photoresist is removed. Referring to FIG. 9 to FIG. 11, a specific example will be described as follows.

Step 200: photoresist is spin-coated, and a patterning process is performed through a double-tone mask, so as to form a fully-retained region, a partially-retained region and a fully-removed region of the photoresist.

Photoresist is spin-coated on the metal thin film 3, and a patterning process is performed with a double-tone mask. After exposure and development, the structure shown in FIG. 9 is formed with the photoresist, that is, a photoresist fully-retained region 10a, a partially-retained region 10b and a fully-removed region 10c are formed with the photoresist. The fully-retained region 10a corresponds to a region of a shielding portion, which is fully lightproof, of the mask, the partially-retained region 10b corresponds to a region of a partially transmissive portion of the half-tone or grey-tone mask, and the fully-removed region 10c corresponds to a fully transmissive region of the mask. Positive photoresist is described as an example here.

Step 201: the data line, the source electrode, the drain electrode and the pixel electrode are formed through etching, and the metal thin film on the surfaces of the data line, the source electrode, the drain electrode and the pixel electrode is left.

For example, the transparent substrate 1 is placed within an etching chamber for etching. Firstly, the metal thin film 3 and the transparent conductive thin film 2 under the fully-removed region 10c of the photoresist 10 are etched off, as shown in FIG. 10, a data line 2b, a source electrode 2c, a drain electrode 2d and a pixel electrode 2a formed by the transparent conductive thin film 2 are obtained, and the metal thin film 3 on the data line 2b, the source electrode 2c, the drain electrode 2d and the pixel electrode 2a is left.

Step 202: Ashing is performed on the photoresist to remove the photoresist in the partially-retained region, and the metal thin film on the surface of the pixel electrode is removed through etching.

As shown in FIG. 11, ashing is performed on the photoresist 10, so that the photoresist in the partially-retained region 10b is removed and thus the metal thin film 3 under the partially-retained region 10b is exposed, and moreover the photoresist in the fully-retained region 10a is partially retained. Next, etching is performed again, so that the metal thin film 3 corresponding to the surface of the pixel electrode 2a is removed and thus the underlying pixel electrode 2a is exposed. During etching of the metal thin film 3, it is possible that in the partially-retained region 10b, the metal thin film 3 is etched off and the transparent conductive thin film 2 is left by selecting an etch solution or etch gas which only etches the metal, or controlling the etch time.

Finally, the formed OTFT array is shown in FIG. 3 and FIG. 4. The metal thin film 3 is attached to surfaces of the data line 2b, the source electrode 2c and the drain electrode 2d, and the conductive properties of the data line 2b, the source electrode 2c and the drain electrode 2d formed by the transparent conductive thin film 2 are improved due to better conductive properties of the metal thin film 3. Thus, the charging speed of the pixel electrode 2a by the data line 2b through the source electrode 2a and the drain electrode 2d is increased.

In correspondence with one of the above-mentioned methods for manufacturing an OTFT array substrate, there is further provided a display device according to an embodiment of the invention. The display device provided by the embodiment includes a top-gate type TFT array substrate as stated above. The display device can be used for a liquid crystal panel, an electronic paper, an OLED panel, a liquid crystal television, a liquid crystal display, a digital photo frame, a cell phone, a tablet computer, or other product or component having display function.

An example of the display device is a liquid crystal display device, in which, an array substrate and an opposing substrate are provided opposed to each other so as to form a liquid crystal cell with a liquid crystal material filled therein. The opposing substrate is a color filter substrate for example. A pixel electrode for each pixel unit of the array substrate acts to apply an electric field for controlling degree of rotation of the liquid crystal material so as to realize a display operation. In some examples, the liquid crystal liquid device further includes a backlight source for providing the array substrate with backlight.

In the OTFT array substrate and method for manufacturing the same provided by embodiments of the invention, the structures of the organic semiconductor layer, the gate insulating layer, the gate electrode, the gate line, the common electrode, the common electrode line and so on in the OTFT array substrate are formed in a quick and high-effective way by forming the first bank insulating layer and the second bank insulating layer with the photosensitive resin, respectively, and forming the organic semiconductor layer, the gate insulating layer, the gate electrode, the gate line, the common electrode and the common electrode line by printing in the through holes and the openings of the first bank insulating layer and the second bank insulating layer. Thus, the materials for forming structures of the organic semiconductor layer, the gate insulating layer, the gate electrode, the gate line, the common electrode, the common electrode line and so on can be saved, and moreover accuracy of the structures of the organic semiconductor layer, the gate insulating layer, the gate electrode, the gate line, the common electrode, the common electrode line and so on are controlled better.

The foregoing are merely specific embodiments of the present invention. The protection scope of the invention shall be defined by the protection scope of the claims.

The invention claimed is:

1. An organic thin film transistor array substrate, comprising a pixel structure formed on a transparent substrate, wherein the pixel structure includes: a gate line, a data line, an organic thin film transistor, a pixel electrode, a common electrode line and a common electrode;

the organic thin film transistor includes: a gate electrode, a gate insulating layer, an organic semiconductor layer, a source electrode and a drain electrode;

above the data line, the source electrode, the drain electrode and the pixel electrode, there are disposed in order a first bank insulating layer and a second bank insulating layer from bottom to top;

in the first bank insulating layer, there are provided a first through hole, a first opening and a second opening;

the source electrode and the drain electrode are located on two sides of the first through hole;

in the first opening, there is formed the gate line by printing, and in the second opening, there is formed the common electrode line by printing;

in the first through hole, there are formed in order the organic semiconductor layer, the gate insulating layer and the gate electrode by printing from bottom to top, the gate electrode is connected with the gate line, and the organic semiconductor layer is connected with the source electrode and the drain electrode.

2. The organic thin film transistor array substrate claimed as claim 1, wherein in the second bank insulating layer, there are provided a third opening and a second through hole intercommunicated with each other, and the second through hole is communicated with the second opening; and in the third opening and the second through hole, there is formed the common electrode by printing, wherein the common electrode and the common electrode line are connected with each other through the second through hole.

3. The organic thin film transistor array substrate claimed as claim 1, wherein on surfaces of the source electrode, the drain electrode and the data line, there is disposed a metal thin film.

4. The organic thin film transistor array substrate claimed as claim 3, wherein the source electrode and the drain electrode extend into the first through hole, the source electrode and the drain electrode are not connected with each other, and a distance between the source electrode and the drain electrode is smaller than a distance between metal thin films on two sides of the first through hole.

5. The organic thin film transistor array substrate claimed claim 1, wherein a thickness of the organic semiconductor layer is larger than a thickness of each of the source electrode and the drain electrode.

6. The organic thin film transistor array substrate claimed as claim 1, wherein the organic semiconductor layer is connected with sidewalls of the source electrode and the drain electrode on two sides of the first through hole.

7. The organic thin film transistor array substrate claimed as claim 1, wherein the first bank insulating layer and the second bank insulating layer are of a photosensitive resin material.

8. The organic thin film transistor array substrate claimed as claim 1, wherein a material for the data line, the source electrode, the drain electrode, the pixel electrode and the common electrode is indium tin oxide or indium zinc oxide.

9. The organic thin film transistor array substrate claimed as claim 1, wherein a material of the organic semiconductor layer is a thiophene compound or a phthalocyanine compound.

10. The organic thin film transistor array substrate claimed as claim 1, wherein a material of the gate insulating layer is polyvinyl alcohol.

11. The organic thin film transistor array substrate claimed as claim 1, wherein the gate electrode is of one of a conductive polythiophene compound, copper or silver.

12. The organic thin film transistor array substrate claimed as claim 1, wherein top surfaces of the gate line disposed in the first opening, the common electrode line disposed in the second opening and the gate electrode disposed in the first through hole are flush with a top surface of the first bank insulating layer.

13. The organic thin film transistor array substrate claimed as claim 3, wherein a material for the metal thin films is one of aluminum, tungsten, chromium, tantalum, molybdenum or copper.

14. A method for manufacturing an organic thin film transistor array substrate, comprising:

depositing a transparent conductive thin film on a transparent substrate, and forming a data line, a source electrode, a drain electrode and a pixel electrode through a patterning process;

coating and solidifying a photosensitive resin to form a first bank insulating layer, performing exposure and development in the first bank insulating layer so as to form a first through hole, a first opening and a second opening, forming an organic semiconductor layer in the first through hole by printing, printing the gate insulating layer on the organic semiconductor layer, and forming the gate electrode, the gate line and the common electrode line on the gate insulating layer and in the first opening and the second opening by printing, wherein the organic semiconductor layer is connected with the source electrode and the drain electrode; and coating and solidifying a photosensitive resin again to form a second bank insulating layer, forming a third opening and a second through hole intercommunicated with each other in the second bank insulating layer by exposure and development, and forming a common electrode in the second through hole and the third opening by printing.

15. The method for manufacturing the organic thin film transistor array substrate claimed as claim 14, wherein after the transparent conductive thin film is deposited on the transparent substrate, the method further includes:

depositing a metal thin film;

the formation of the data line, the source electrode, the drain electrode and the pixel electrode through the patterning process specifically includes:

spin-coating photoresist, and performing exposure and development through a double-tone mask to form a fully-retained region, a partially-retained region and a fully-removed region of the photoresist;

forming the data line, the source electrode, the drain electrode and the pixel electrode through etching with the metal thin film on surfaces of the data line, the source electrode, the drain electrode and the pixel electrode being remained;

performing ashing on the photoresist so as to remove the partially-retained region, and removing the metal thin film on the surface of the pixel electrode through etching and stripping the remaining photoresist.

16. The method for manufacturing the organic thin film transistor array substrate claimed as claim 14, wherein the first bank insulating layer is exposed through a double-tone mask.

17. A display device, comprising the organic thin film transistor array substrate claimed as claim 1.

* * * * *